US009530639B2

(12) United States Patent
Cho et al.

(10) Patent No.: US 9,530,639 B2
(45) Date of Patent: Dec. 27, 2016

(54) METHOD OF PREPARING ZNO NANOWIRE AND ZNO NANOWIRE PREPARED THEREBY

(71) Applicants: SAMSUNG ELECTRONICS CO., LTD., Suwon-si (KR); AJOU UNIVERSITY INDUSTRY-ACADEMIC COOPERATION FOUNDATION, Suwon-si (KR)

(72) Inventors: Kyunghoon Cho, Suwon-si (KR); Sangwook Kim, Suwon-si (KR); Donghyeok Choi, Suwon-si (KR)

(73) Assignees: SAMSUNG ELECTRONICS CO., LTD., Suwon-si (KR); AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 14/537,207

(22) Filed: Nov. 10, 2014

(65) Prior Publication Data

US 2015/0279669 A1 Oct. 1, 2015

(30) Foreign Application Priority Data

Mar. 28, 2014 (KR) .................. 10-2014-0036980

(51) Int. Cl.
*B05D 5/12* (2006.01)
*C09K 11/02* (2006.01)
(Continued)

(52) U.S. Cl.
CPC ......... *H01L 21/02565* (2013.01); *B82Y 10/00* (2013.01); *H01L 21/02422* (2013.01);
(Continued)

(58) Field of Classification Search
CPC .. H01L 31/0326; H01L 31/18; H01L 31/0322; H01L 21/02568; H01L 33/502; H01L 21/02557; H01L 21/02601; H01L 21/02628; H01L 31/0749; H01L 51/4226; H01L 21/02491; H01L 21/0256; H01L 2224/48091; H01L 31/0296; H01L 31/0336; H01L 33/14; H01L 33/28; H01L 33/32; H01L 33/44
(Continued)

(56) References Cited

U.S. PATENT DOCUMENTS

2011/0008245 A1 1/2011 Park et al.
2011/0056541 A1* 3/2011 Martinez ............. H01L 31/0296
136/252
(Continued)

FOREIGN PATENT DOCUMENTS

| KR | 10-0614130 B1 | 8/2006 |
| KR | 10-1012217 B1 | 2/2011 |
| KR | 10-1351551 B1 | 1/2014 |

OTHER PUBLICATIONS

Wang et al. "Large-scale synthesis of ZnSe nanoribbons on zinc substrate" May 28, 2009.*
(Continued)

*Primary Examiner* — Kimberly Rizkallah
*Assistant Examiner* — Brian Turner
(74) *Attorney, Agent, or Firm* — Sughrue Mion, PLLC

(57) ABSTRACT

A method of preparing a ZnO nanowire, and a ZnO nanowire prepared by the method are provided. The method of preparing a ZnO nanowire includes: preparing a zinc chalcogenide solution by dissolving zinc chalcogenide in a solvent; applying the zinc chalcogenide solution onto a substrate; drying the zinc chalcogenide solution applied onto
(Continued)

the substrate; and annealing the substrate in the presence of oxygen after the drying the zinc chalcogenide solution.

17 Claims, 9 Drawing Sheets

(51) Int. Cl.
  *H01L 33/32* (2010.01)
  *H01L 31/18* (2006.01)
  *H01L 41/37* (2013.01)
  *H01L 31/0328* (2006.01)
  *H01L 21/02* (2006.01)
  *B82Y 10/00* (2011.01)
  *H01L 29/24* (2006.01)
  *H01L 29/06* (2006.01)

(52) U.S. Cl.
  CPC .. *H01L 21/02554* (2013.01); *H01L 21/02603* (2013.01); *H01L 21/02614* (2013.01); *H01L 21/02628* (2013.01); *H01L 29/0673* (2013.01); *H01L 29/24* (2013.01)

(58) Field of Classification Search
  USPC ....... 257/40, 461, 104, 98, E33.028; 438/93, 438/94, 95, 29, 104, 84; 977/773
  See application file for complete search history.

(56) References Cited

U.S. PATENT DOCUMENTS

| | | | |
|---|---|---|---|
| 2011/0068010 A1* | 3/2011 | Garimella | B24B 1/04 205/80 |
| 2011/0108873 A1* | 5/2011 | Richardson | H01L 33/14 257/98 |
| 2014/0220728 A1* | 8/2014 | Hillhouse | H01L 31/0326 438/95 |

OTHER PUBLICATIONS

David B. Mitzi, "Polymorphic One-Dimensional (N2H4)2ZnTe: Soluble Precursors for the Formation of Hexagonal or Cubic Zinc Telluride", Inorganic Chemistry, Aug. 31, 2005, pp. 7078-7086, vol. 44, No. 20.

David B. Mitzi, "Solution Processing of Chalcogenide Semiconductors via Dimensional Reduction", Advanced Materials, Aug. 21, 2009, pp. 3141-3158, vol. 21, Issue 31.

Trindade, et al., "Preparation of Zinc Oxide and Zinc Sulfide Powders by Controlled Precipitation from Aqueous Solution", Journal of Materials Chemistry, Jan. 1, 1994, pp. 1611-1617, 4(10).

* cited by examiner

MX$_3$
3-D (a)

A$_b$MX$_4$
2-D

METHOD OF PREPARING ZNO NANOWIRE AND ZNO NANOWIRE PREPARED THEREBY

RELATED APPLICATIONS

This application claims priority from Korean Patent Application No. 10-2014-0036980, filed on Mar. 28, 2014 in the Korean Intellectual Property Office, the disclosure of which is incorporated by reference herein in its entirety.

BACKGROUND

1. Field

Methods and apparatuses consistent with exemplary embodiments relate preparing ZnO nanowires and ZnO nanowires prepared by the methods, and more particularly, to preparing ZnO nanowires by using zinc chalcogenide solutions and ZnO nanowires prepared by those methods.

2. Description of the Related Art

ZnO nanowires are used in a variety of fields and apparatuses, including, for example, sensors, energy harvesting devices, and future nanowire devices.

In general, ZnO nanowires prepared by vapor growth may be synthesized directly on a substrate via chemical vapor deposition (CVD) under high-temperature, high-vacuum conditions in the presence of a catalyst such as gold (Au) on the substrate, such that the synthesized ZnO nanowires are adhered to the substrate.

It also has been attempted to prepare ZnO nanowires via a low-cost liquid phase method. The liquid phase method, which is a method of preparing ZnO nanowires in an aqueous solution including a surfactant, may form free-standing ZnO nanowires on a substrate, i.e., ZnO nanowires that are not adhered to the substrate. However, the surfactant used in the liquid phase method to control the shape and size of ZnO nanowires may remain on the surfaces of the ZnO nanowires after such a preparation, thus creating contact resistance or an energy barrier on the surfaces of the ZnO nanowires.

SUMMARY

One or more exemplary embodiments relate to methods of preparing ZnO nanowires by using zinc chalcogenide solutions.

One or more exemplary embodiments also relate ZnO nanoparticles prepared by the methods.

According to an aspect of an exemplary embodiment, there is provided a method of preparing a ZnO nanowire, the method including: preparing a zinc chalcogenide solution by dissolving zinc chalcogenide in a solvent; applying the zinc chalcogenide solution onto a substrate; drying the zinc chalcogenide solution applied onto the substrate; and annealing the substrate in the presence of oxygen.

The zinc chalcogenide may be a p-type semiconductor.

The zinc chalcogenide may include ZnTe, ZnSe, ZnS, or a combination thereof.

The solvent may include hydrazine, hydrazine hydrate, methyl hydrazine, dimethyl hydrazine, ethylenediamine, 1,3-diaminopropane, phenylenediamine, ethylamine, propylamine, diethylamine, or a combination thereof.

The preparing the zinc chalcogenide solution may be performed via dimensional reduction of the zinc chalcogenide.

The preparing the zinc chalcogenide solution may include: dissolving a chalcogen in a solvent to obtain a chalcogen solution; adding zinc chalcogenide to the chalcogen solution to obtain a first slurry; heating the first slurry to dissolve the zinc chalcogenide in the chalcogen solution, thereby obtaining a second slurry including a zinc chalcogenide solution; and filtering the second slurry to obtain the first zinc chalcogenide solution.

The chalcogen may include tellurium (Te), selenium (Se), sulfur (S), or a combination thereof.

The heating the first slurry may be performed at a temperature of about 70° C. to about 200° C.

The preparing the zinc chalcogenide solution may further include adding the first zinc chalcogenide solution into an excess of a cleaning solvent to obtain a third slurry in which the zinc chalcogenide is precipitated; filtering the third slurry to separate the precipitated zinc chalcogenide from the third slurry; and dissolving the separated zinc chalcogenide in the solvent to prepare a second zinc chalcogenide solution.

The cleaning solvent may include methanol, ethanol, butanol, isopropanol, acetone, or a combination thereof.

The preparing the zinc chalcogenide solution may be performed by dissolving zinc and a chalcogen in the solvent.

The concentration of the zinc chalcogenide in the zinc chalcogenide solution may be in the range of from about $10^{-6}$M to about 10M.

The applying the zinc chalcogenide solution onto the substrate may be performed by dropping the zinc chalcogenide solution onto the substrate, or dropping the zinc chalcogenide solution onto the substrate and spin-coating the same on the substrate.

The drying the zinc chalcogenide solution may be performed at a temperature of from about 70° C. to about 200° C.

The annealing the substrate may be performed in air.

The annealing the substrate may be performed at a temperature of from about 100° C. to about 300° C.

The ZnO nanowire may be a free-standing nanowire that is not adhered to the substrate.

According to an aspect of another exemplary embodiment there is provided a ZnO nanowire prepared by any of the methods described above and represented by

$ZnX_\alpha O_\beta$, wherein X is tellurium (Te), selenium (Se), or sulfur (S);
α is a real number from 0 to 0.95; and
β is a real number from 0.05 to 1.
The ZnO nanowire may not include an organic ligand.
The ZnO nanowire may be an n-type semiconductor.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
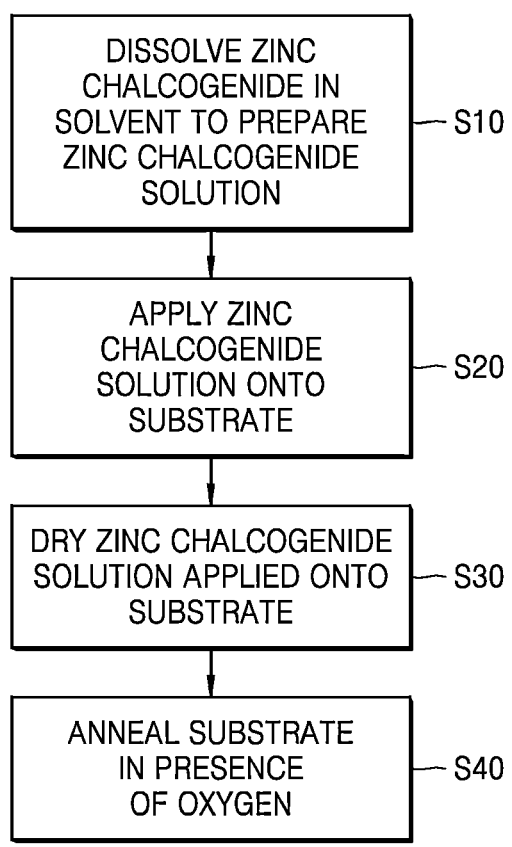
FIG. 1 is a flowchart of a method of preparing a ZnO nanowire according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, methods of preparing ZnO nanowires, according to exemplary embodiments of the present disclosure, will be described in greater detail.

As used herein, the term "ZnO nanowire" refers to a zinc-chalcogen-oxide nanowire having the same or similar characteristics as those of zinc-oxide.

Referring to FIG. 1, according to an exemplary embodiment, a method of preparing a ZnO nanowire may include dissolving zinc chalcogenide in a solvent to prepare a zinc chalcogenide solution (S10); applying the zinc chalcogenide solution onto a substrate (S20); drying the zinc chalcogenide solution applied onto the substrate (S30); and annealing the substrate in the presence of oxygen after the zinc chalcogenide solution is dried (S40).

The zinc chalcogenide may be a p-type semiconductor.

The zinc chalcogenide may be a polymorph.

The zinc chalcogenide may include ZnTe, ZnSe, ZnS, or a combination thereof.

The zinc chalcogenide may be in powder form.

The solvent may include hydrazine, hydrazine hydrate, methyl hydrazine, dimethyl hydrazine, ethylenediamine, 1,3-diaminopropane, phenylenediamine, ethylamine, propylamine, diethylamine, or a combination thereof.

The hydrazine may be a hydrazine hydrate, and may be, for example, a hydrazine monohydrate.

The preparing of the zinc chalcogenide solution may be performed via dimensional reduction of the zinc chalcogenide.

According to the article "Solution Processing of Chalcogenide Semiconductors via Dimensional Reduction" by David B. Mitzi (*Adv. Mater.* 2009, 21, 3141-3158), the term "dimensional reduction" refers to the process of dismantling an extended metal-anion (M-X) framework of a parent compound, $MX_a$, upon reaction with an ionic reagent ($A_bX$) to form a new compound ($A_{nb}MX_{a+n}$). The "A" cations, which are more electropositive than the metal "M", do not form strong covalent bonds with the "X" anions and therefore may be treated as lying outside the M-X framework. "X" represents a chalcogen, and a, b, and n are each independently a positive real number. The "X" anions introduced into the M-X framework terminate connections between metal centers in the M-X framework, yielding a less tightly connected or lower-dimensional framework.

Hereinafter, a method of preparing a metal chalcogenide solution by dimensional reduction will be described in greater detail with reference to FIGS. 2A, 2B, 2C and 2D. The representations in FIGS. 2A, 2B, 2C and 2D are cited from the article by David Mitzi referenced above.

FIGS. 2A, 2B, 2C and 2D are schematic representations of dimensional reduction for a framework of corner-sharing $MX_6$ octahedra (i.e., M-X framework). In FIGS. 2A, 2B, 2C and 2D, the M and X atoms are represented by black and white spheres, respectively, and 3-D, 2-D, 1-D, and 0-D denote 3-dimensions, 2-dimensions, 1-dimension, and 0-dimensions, respectively.

Figure 2A:
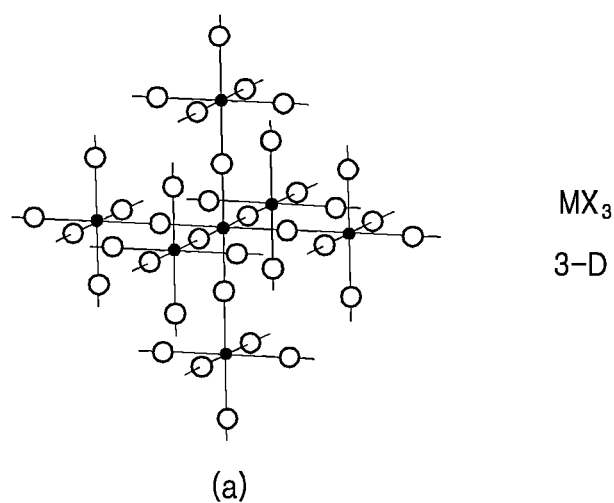
FIGS. 2A, 2B, 2C and 2D are schematic views for explaining a method of preparing a metal chalcogenide solution via dimensional reduction.
Figure 2B:
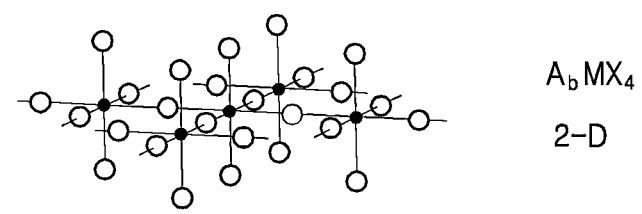
Figure 2C:
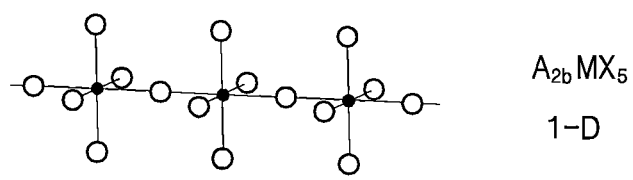
Figure 2D:
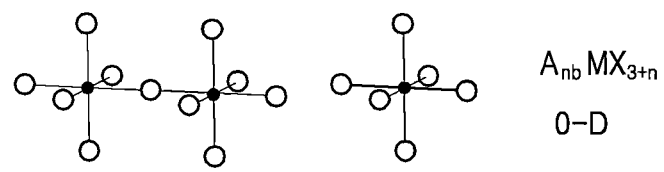

In FIGS. 2A, 2B, 2C and 2D, a reaction with $A_bX$ incorporates additional X atoms into the M-X framework, progressively reducing the connectedness and effective dimensionality of the M-X framework. In FIG. 2D, after incorporating n units (n>2) of AbX into the M-X framework, the M-X framework is reduced to isolated oligomeric or monomeric components. The M-X framework is insoluble in a solvent. The larger n is, the larger the solubility of the isolated oligomeric or monomeric components in the solvent. For clarity, the "A" atoms are not shown in FIGS. 2A, 2B, 2C and 2D.

In the method of preparing a ZnO nanowire, step S10 may be performed based on the same principle as in FIGS. 2A, 2B, 2C and 2D. In other words, step S10 is a process of incorporating chalcogen (X) units into a zinc chalcogenide (ZnX) framework to dismantle the zinc chalcogenide (ZnX) framework into oligomeric or monomeric components (anionic species ($MX_c^-$, where c is a positive real number greater than 1)), which are then dissolved in the solvent to obtain the zinc chalcogenide solution, as described below.

Figure 3:
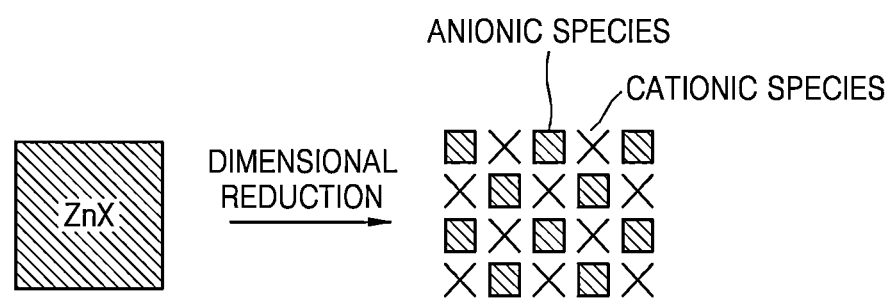
FIG. 3 is a schematic view for explaining the principle of preparing a zinc chalcogenide solution via dimensional reduction.

Step S10 may be more easily understood with reference to FIG. 3.

Referring to FIG. 3, the zinc chalcogenide (ZnX) framework is dismantled into an anionic species ($MX_c^-$, where c is a positive real number greater than 1) and a cationic species ($X^{d+}$, d is an integer of 1 to 6) via dimensional reduction. The anionic species may be dissolved in the solvent, while the cationic species may be removed using a cleaning solvent that will be described later.

In step S10, a surfactant is not necessary and may not be used. Accordingly, the ZnO nanowire obtained from step S40 may not include an organic ligand originating from a surfactant. As used herein, the surfactant is not specifically limited and may be any common surfactant available in the art.

In step S10, water or a water-containing solvent is not necessary and may not be used. Accordingly, the zinc chalcogenide solution finally obtained from step S10 may not include water.

Hereinafter, exemplary embodiments of step S10 will be described in greater detail.

Figure 4:
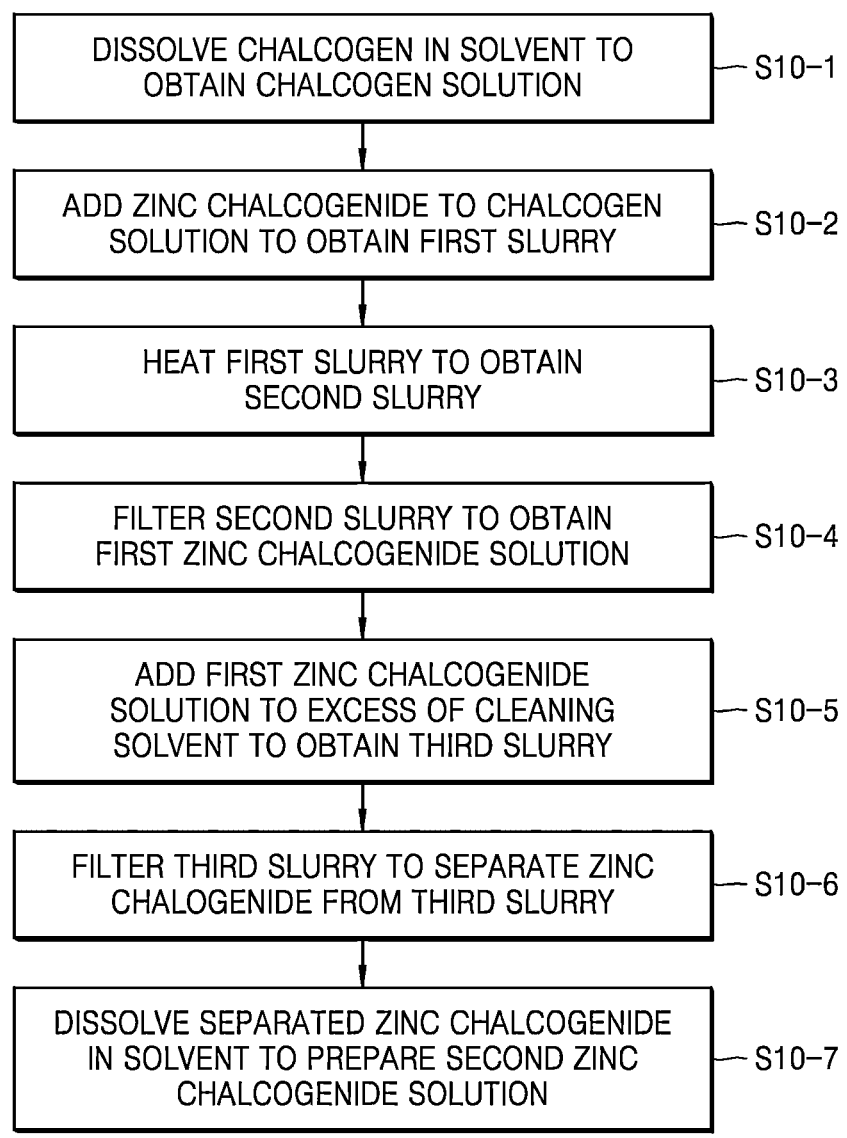
FIG. 4 is a flowchart of a method of the dissolving the zinc chalcogenide in the solvent to prepare the zinc chalcogenide solution according to an exemplary embodiment.

Referring to FIG. 4, according to an exemplary embodiment, the dissolving the zinc chalcogenide in the solvent to prepare the zinc chalcogenide solution (S10) may include dissolving a chalcogen in a solvent to obtain a chalcogen solution (S10-1); adding zinc chalcogenide to the chalcogen solution to obtain a first slurry (S10-2); heating the first slurry to dissolve the zinc chalcogenide in the chalcogen solution, thereby obtaining a second slurry including a zinc chalcogenide solution (S10-3); and filtering the second slurry to obtain a first zinc chalcogenide solution (S10-4).

Though the chalcogen is dissolved directly in the solvent, the zinc chalcogenide may be dissolved in the solvent via dimensional reduction, as described above, and need not be dissolved directly in the solvent.

The chalcogen may include Te, Se, S, or a combination thereof.

In step S10-1, the concentration of chalcogen in the chalcogen solution may be in the range of from about $10^{-6}$M to about 20M. As used herein, the molarity (M) refers to the number of moles of a solute dissolved in 1 liter of a solution or slurry.

Step S10 may further include removing the undissolved chalcogen mixed with the chalcogen solution, for example, by filtering, between step S10-1 and step S10-2.

In step S10-2, the concentration of the zinc chalcogenide in the first slurry may be in the range of from about $10^{-6}$M to about 10M.

In step S10-3, dimensional reduction of the zinc chalcogenide may occur so as to generate oligomeric or monomeric components of the zinc chalcogenide, which are consequently dissolved in the solvent used to obtain the zinc chalcogenide solution. The oligomeric or monomeric components of the zinc chalcogenide may be generated from the dismantling of the zinc chalcogenide by attack of the chalcogen in the first slurry to zinc chalcogenide and consequent incorporation of the chalcogen into the framework of the zinc chalcogenide.

Step S10-3 may be performed at a temperature of from about 70° C. to about 200° C. When the temperature of step S10-3 is within this range, the reaction may occur smoothly, but not rapidly, thereby preventing the risk of explosion.

In step S10-4, the residue of the zinc chalcogenide, which does not undergo dimensional reduction and thus remains undissolved in the solvent, may be removed.

The preparing the zinc chalcogenide solution (S10) may further include adding the first zinc chalcogenide solution to an excess of a cleaning solvent to obtain a third slurry in which the zinc chalcogenide is precipitated (S10-5); filtering the third slurry to separate the precipitated zinc chalcogenide from the third slurry (S10-6); and dissolving the separated zinc chalcogenide in the solvent to prepare a second zinc chalcogenide solution (S10-7).

The cleaning solvent may not dissolve the zinc chalcogenide, but may dissolve the chalcogen.

The cleaning solvent may include methanol, ethanol, butanol, isopropanol, acetone, or a combination thereof.

As used herein, the term "excess of a cleaning solvent" refers to an amount of cleaning solvent that is about 2 to 20 times higher by volume than that of the first zinc chalcogenide solution.

In step S10-5, the zinc chalcogenide in the first zinc chalcogenide solution may not be dissolved in the cleaning solvent as a main part of the third slurry, thereby being precipitated. In step S10-5, a part of the chalcogen contained in the zinc chalcogenide may be dissolved in the cleaning solvent so as to get out of the zinc chalcogenide, so that the proportion of the chalcogen in the zinc chalcogenide may be reduced.

In step S10-6, a liquid material may be removed from the third slurry so as to obtain a solid zinc chalcogenide.

In step S10-7, the proportion of the chalcogen of the zinc chalcogenide in the second zinc chalcogenide solution obtained in step S10-7 may be smaller than that of the chalcogen of the zinc chalcogenide in the first zinc chalcogenide solution.

In step S10, steps S10-5, S10-6, and S10-7 may be performed repeatedly two times or more. The larger the number of repetitions of steps S10-5, S10-6, and S10-7, the lower the proportion of the chalcogen of the zinc chalcogenide in the finally obtained zinc chalcogenide solution may become.

In some embodiments, the preparing the zinc chalcogenide solution in step S10 may be performed by dissolving zinc and a chalcogen in the solvent. In this case, the zinc and the chalcogen may both be used in powder form.

In step S10, a concentration of the zinc chalcogenide in the zinc chalcogenide solution as finally prepared in step S10 may be in the range of from about $10^{-6}$M to about 10M. When the concentration of the zinc chalcogenide in the zinc chalcogenide solution as finally prepared in step S10 is within this range, the zinc chalcogenide solution may be easily prepared and may have high usefulness.

In an exemplary embodiment, the applying the zinc chalcogenide solution onto the substrate (S20) may be performed by dropping the zinc chalcogenide solution onto the substrate but not followed by spin coating of the zinc chalcogenide solution.

In another exemplary embodiment, the applying the zinc chalcogenide solution onto the substrate (S20) may be performed by dropping the zinc chalcogenide solution onto the substrate and spin-coating the same on the substrate.

For example, the substrate may be a glass substrate, a wafer substrate, an indium tin oxide (ITO) glass substrate, a semiconductor substrate, an oxide substrate, or a metal substrate.

The drying of the zinc chalcogenide solution in step S30 may be performed in an anaerobic atmosphere, for example, in a nitrogen atmosphere.

In step S30, the solvent may be removed from the zinc chalcogenide solution via evaporation.

The drying the zinc chalcogenide solution (S30) may be performed at a temperature of about 70° C. to about 200° C. When the temperature of step S30 is within this range, it may be easy both to evaporate the solvent and to control the nanowire structure of the final ZnO product.

In the annealing the substrate in the presence of oxygen (S40), the zinc chalcogenide positioned on the substrate may be converted into a ZnO nanowire.

The annealing the substrate in the presence of oxygen (S40) may be performed in air. When the annealing the substrate (S40) is performed in an anaerobic atmosphere, for example, in a nitrogen atmosphere, the zinc chalcogenide positioned on the substrate may not be converted into the ZnO nanowire and may rather form a zinc chalcogenide film.

The annealing the substrate (S40) may be performed at a temperature of from about 100° C. to about 300° C. When the temperature of the annealing of the substrate in step S40 is within this range, the zinc chalcogenide may be easily converted into ZnO nanowires without causing the ZnO nanowires to be structurally deformed.

The ZnO nanowires resulting from the annealing in step S40 may be in free-standing form not adhered to the substrate. Accordingly, a process of separating the ZnO nanowires from the substrate may not be necessary. Thus, manufacturing costs and the fraction of defective ZnO nanowires may be reduced.

The size (length and aspect ratio), shape, and uniformity of the ZnO nanowires may be controlled by adjusting the concentration of the zinc chalcogenide in the zinc chalcogenide solution in step S10, the drying temperature in step S30, and the annealing temperature in step S40.

According to another embodiment, there is provided a ZnO nanowire prepared by any of the methods according to the above-described embodiments and represented by Formula 1:

$$ZnX_\alpha O_\beta \qquad \text{Formula 1}$$

In Formula 1, X is tellurium (Te), selenium (Se), or sulfur (S); α is a real number of from 0 to 0.95; and β is a real number of from 0.05 to 1.

The ZnO nanowire may not include an organic ligand, and thus may have zero contact resistance and no energy barrier.

The ZnO nanowire may be an n-type semiconductor.

The ZnO nanowire may be crystalline.

The ZnO nanowire may be an n-type semiconductor having an energy band gap of about 3.4 eV.

The ZnO nanowire may be used in a variety of fields, including in high-voltage electrical and electronic devices, piezoelectric devices, gas sensors, ultraviolet sunscreen agents, and transparent conductive films.

One or more embodiments will now be described in detail with reference to the following examples. However, these examples are for illustrative purposes only and are not intended to limit the scope of the one or more embodiments of the present disclosure.

Examples 1 to 3

Preparation of ZnO Nanowires (Preparation of ZnTe Solution)

First, tellurium (Te) powder was dissolved in hydrazine monohydrate to prepare a Te solution. The undissolved Te powder mixed with the Te solution was removed by filtration. Next, ZnTe powder was added to the filtered Te solution to obtain a first slurry. This first slurry was heated at about 60° C. for about 72 hours while stirring to obtain a second slurry including the ZnTe solution. The second slurry was then filtered to remove the ZnTe powder remaining undissolved in the second slurry to obtain a first ZnTe solution. Next, the following process (also referred to as a "cleaning process") was repeated three times to obtain a second ZnTe solution: An excess of methanol (about 10 times by volume of the first ZnTe solution) was added to the first ZnTe solution to precipitate ZnTe, thereby preparing a third slurry. The third slurry was filtered to separate solid ZnTe from the third slurry, followed by dissolving the solid ZnTe in hydrazine monohydrate. The Te concentration ($C_{Te}$) of the Te solution, the ZnTe concentration ($C_{ZnTe1}$) of the first slurry, and the ZnTe concentration ($C_{ZnTe2}$) of the second ZnTe solution for ZnO nanowires of each of Examples 1 to 3 were obtained. The results are shown in Table 1.

TABLE 1

|  | Example 1 | Example 2 | Example 3 |
|---|---|---|---|
| $C_{Te}$(M) | 1 | 0.2 | 0.2 |
| $C_{ZnTe1}$(M) | 1 | 0.2 | 0.2 |
| $C_{ZnTe2}$(M) | 1 | 0.2 | 0.2 |

(Preparation of ZnO Nanowires)

Three droplets of the second ZnTe solution were dropped onto a glass substrate and then dried in a nitrogen atmosphere at a temperature $T_1$ for about 10 minutes, followed by annealing the glass substrate in air at a temperature $T_2$ for about 30 minutes to obtain ZnO nanowires. The temperatures $T_1$ and $T_2$ for Examples 1 to 3 are shown in Table 2.

TABLE 2

|  | Example 1 | Example 2 | Example 3 |
|---|---|---|---|
| $T_1$ (° C.) | 150 | 150 | 150 |
| $T_2$ (° C.) | 150 | 200 | 300 |

EVALUATION EXAMPLES

Evaluation Example 1

Ingredient Analysis of ZnO Nanowire

The ZnO nanowire of Example 1 was analyzed using an inductively coupled plasma spectrometer (ICP) (SHIMAZU, ICP-8100) before the cleaning process and after three cycles of the cleaning process, and the mole ratio of each ingredient was calculated. The results are shown in Table 3.

TABLE 3

|  | Zn (mole %) | Te (mole %) |
|---|---|---|
| ZnO nanowire before cleaning process | 6.7 | 93.3 |
| ZnO nanowire after 3 cycles of the cleaning process | 51.3 | 48.7 |

Referring to Table 3, the ZnO nanowire after the three cycles of the cleaning process was found to have a sharply reduced proportion of Te, compared to that of the ZnO nanowire before cleaning process.

Evaluation Example 2

Voltage-Current Characteristics Evaluation

Figure 5:
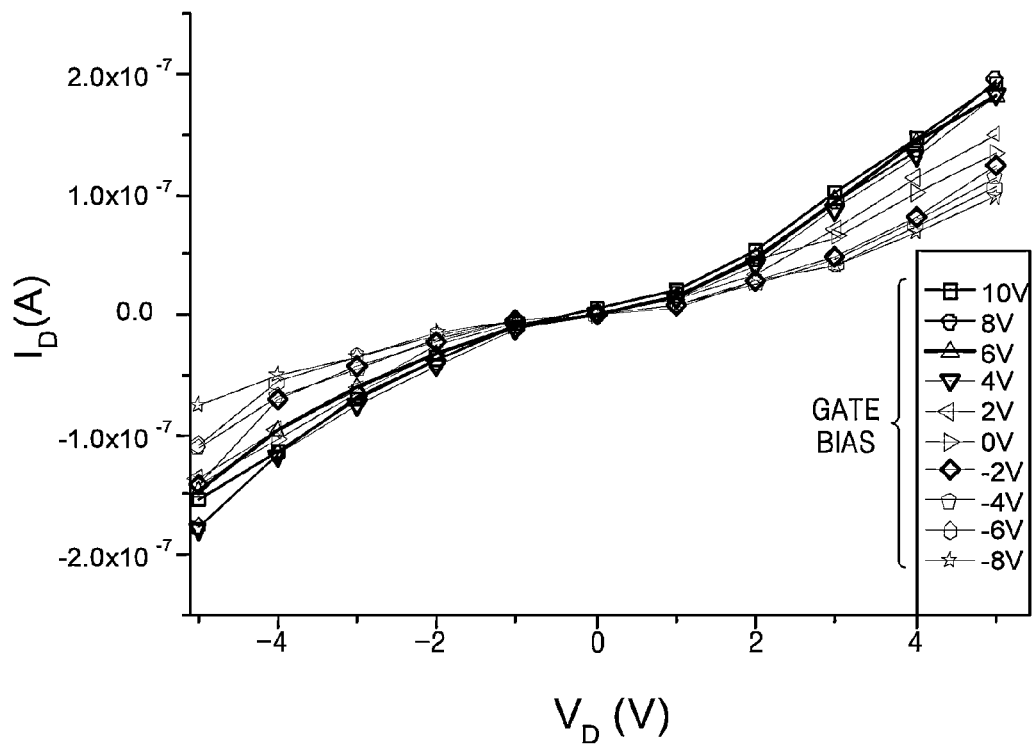
FIG. 5 is a current-voltage (I-V) curve of ZnO nanowires prepared in Example 1.

Voltage-current characteristics of the ZnO nanowire of Example 1 were evaluated using a voltage-current measurement device (self-manufactured). The results are shown in FIG. 5. In FIG. 5, $V_D$ and $I_D$ indicate the drain voltage and the drain current, respectively.

Referring to FIG. 5, the voltage-current curves represent typical characteristics of an n-type semiconductor, indicating that the ZnO nanowire of Example 1 is an n-type semiconductor.

Evaluation Example 3

X-Ray Diffraction (XRD) Pattern Analysis

Figure 6:
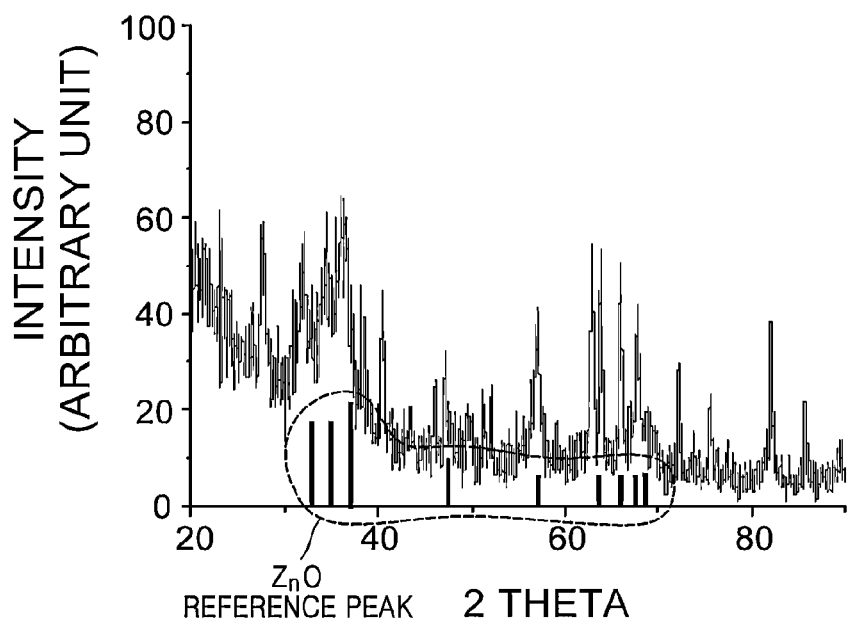
FIG. 6 is an X-ray diffraction (XRD) spectrum of the ZnO nanowires prepared in Example 1.

An XRD pattern of the ZnO nanowire of Example 1 was analyzed using an X-ray diffraction analyzer (Philips, X-Pert PRO) after 1 cycle of the cleaning process. The results are shown in FIG. 6. In FIG. 6, the lower discontinuous peaks represent reference ZnO peaks and the upper continuous peaks represent peaks of the ZnO nanowire of Example 1.

Referring to FIG. 6, the peaks of the ZnO nanowire of Example 1 coincide with the pattern of the reference ZnO peaks. Thus, the ZnO (i.e., zinc-tellurium-oxide) nanowire of Example 1 is expected to have the same or similar characteristics as ZnO (i.e., zinc-oxide) nanowires.

Evaluation Example 4

Surface Image Analysis

Figure 7:
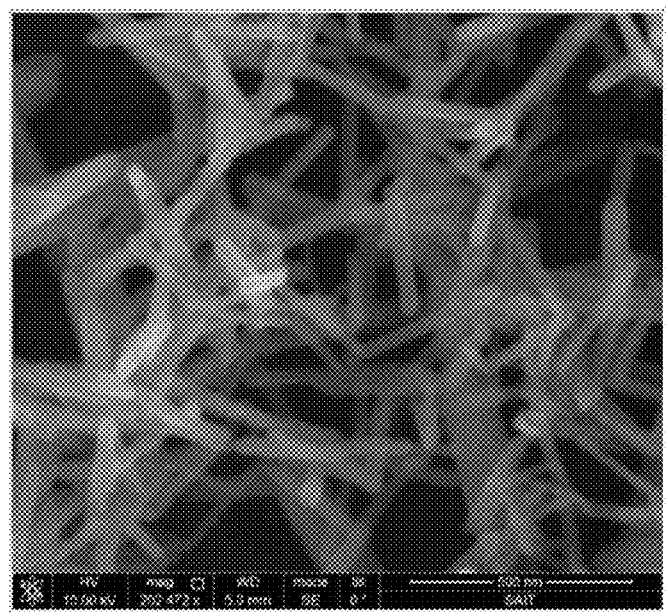
FIG. 7 is a scanning electron microscopic (SEM) image of the ZnO nanowires prepared in Example 1.
Figure 8:
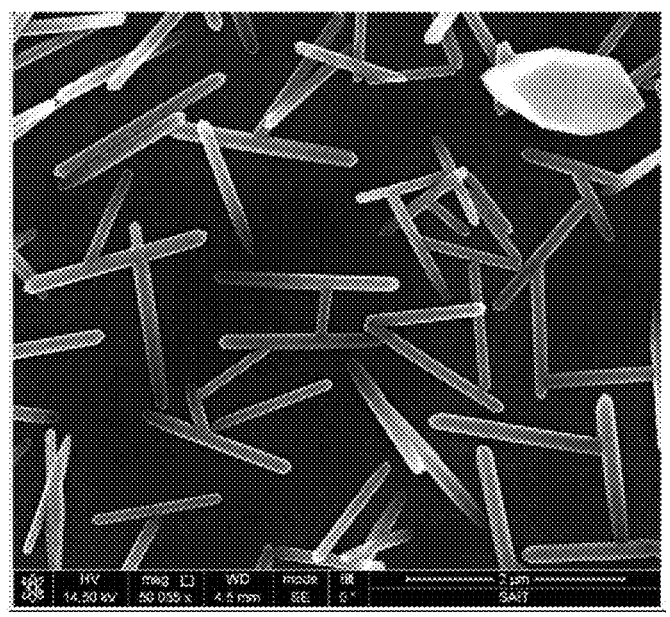
FIGS. 8 and 10 are SEM images of ZnO nanowires prepared in Example 2.
Figure 9:
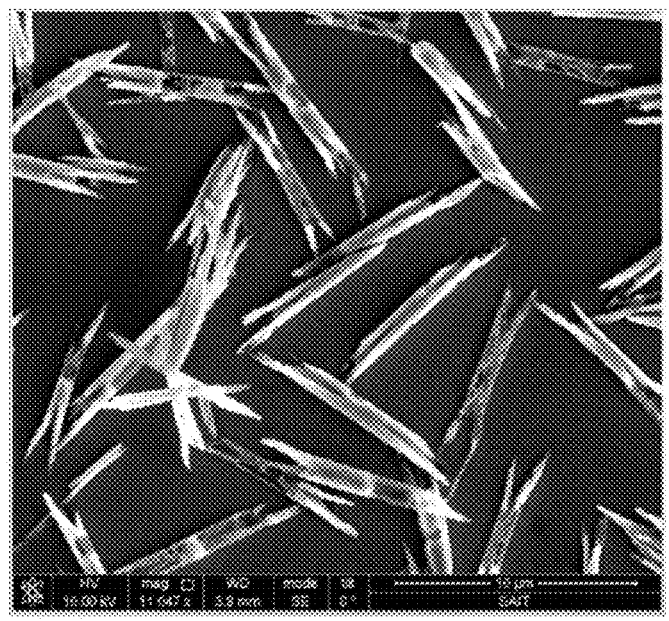
FIG. 9 is a SEM image of ZnO nanowires prepared in Example 3.
Figure 10:
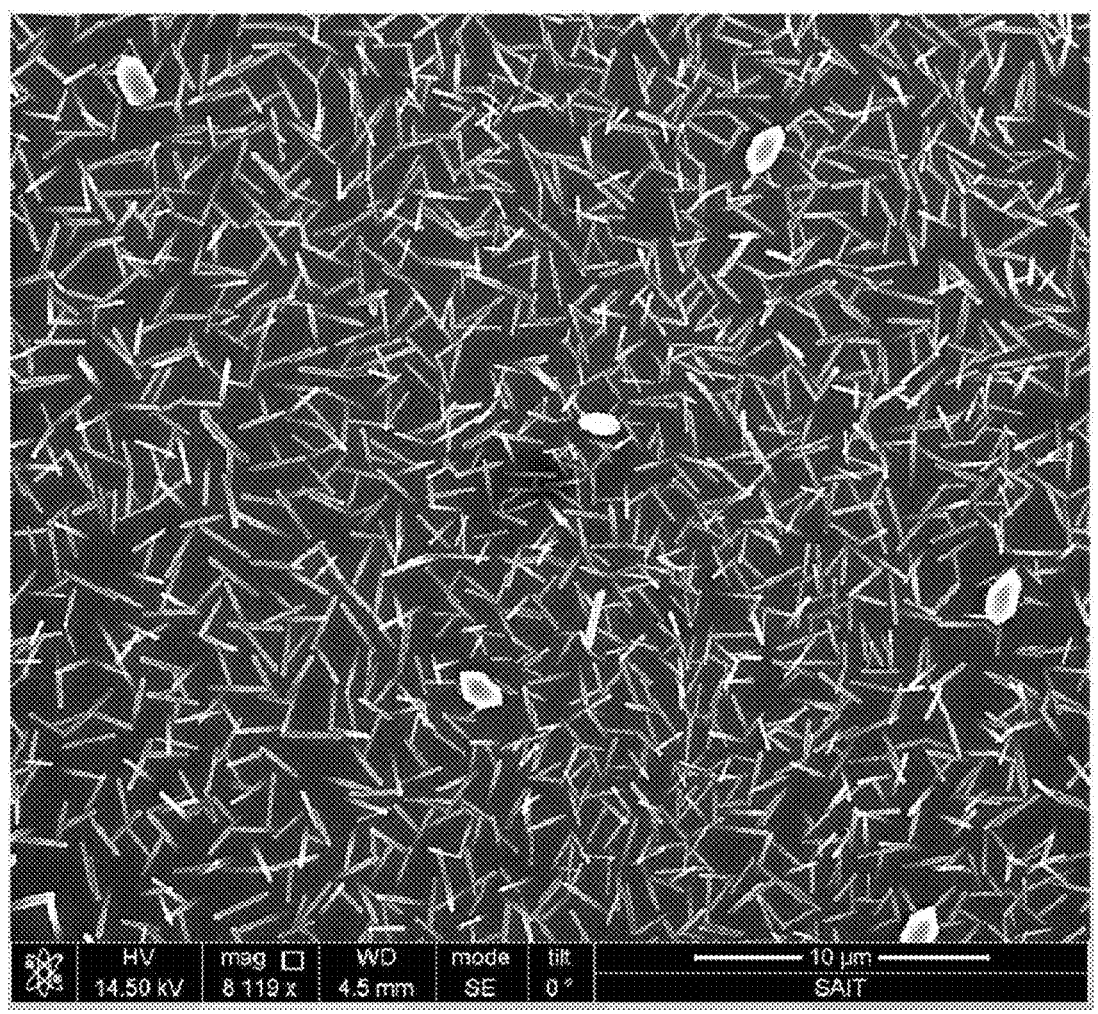

The ZnO nanowires of Examples 1 to 3 were analyzed using scanning electron microscopy (SEM). The SEM images of the ZnO nanowires of Examples 1 to 3 are shown in FIGS. 7 to 10. FIG. 7 is an SEM image of the ZnO nanowires of Example 1; FIGS. 8 and 10 are SEM images of the ZnO nanowires of Example 2; and FIG. 9 is an SEM image of the ZnO nanowires of Example 3. More ZnO nanowires of Example 2 are shown in FIG. 10 than in FIG. 8.

Referring to FIGS. 7 to 9, it was found that the sizes and shapes of ZnO nanowires may be controlled by adjusting the ZnTe concentration, drying temperature, and annealing temperature of the ZnTe solution when preparing the ZnO nanowires.

Referring to FIG. 10, the ZnO nanowires of Example 2 were found to be uniform in size and shape.

As described above, according to the one or more of the above embodiments of the present disclosure, the ZnO preparation method may control the size and shape of ZnO nanowires and may at low cost create ZnO nanowires that have uniform size and shape and are in free-standing form.

The ZnO nanowires prepared by the method may be crystalline, and may have a uniform size and shape and improved electrical characteristics due to low or zero contact resistance because no surfactant is on the surfaces thereof.

It should be understood that the exemplary embodiments described herein should be considered to be descriptive only and do not limit the disclosure. Descriptions of features or aspects within each embodiment should typically be considered as being available for other similar features or aspects in other embodiments.

While exemplary embodiments have been described, it will be understood by those of ordinary skill in the art that various changes in form and details may be made therein without departing from the spirit and scope of the present disclosure as defined by the following claims.

What is claimed is:

1. A method of preparing a ZnO nanowire, the method comprising:
preparing a zinc chalcogenide solution by dissolving zinc chalcogenide in a solvent;
applying the zinc chalcogenide solution onto a substrate;
drying the zinc chalcogenide solution applied onto the substrate; and
annealing the substrate in the presence of oxygen after the drying the zinc chalcogenide solution,
wherein the preparing the zinc chalcogenide solution is performed via dimensional reduction of the zinc chalcogenide and comprises:
dissolving a chalcogen in the solvent to obtain a chalcogen solution;
adding the zinc chalcogenide to the chalcogen solution to obtain a first slurry;
heating the first slurry to dissolve the zinc chalcogenide in the chalcogen solution, thereby obtaining a second slurry including a zinc chalcogenide solution; and
filtering the second slurry.

2. The method of claim 1, wherein the zinc chalcogenide is a p-type semiconductor.

3. The method of claim 1, wherein the zinc chalcogenide comprises ZnTe, ZnSe, ZnS, or a combination thereof.

4. The method of claim 1, wherein the solvent comprises hydrazine, hydrazine hydrate, methyl hydrazine, dimethyl hydrazine, ethylenediamine, 1,3-diaminopropane, phenylenediamine, ethylamine, propylamine, diethylamine, or a combination thereof.

5. The method of claim 1, wherein the chalcogen comprises tellurium (Te), selenium (Se), sulfur (S), or a combination thereof.

6. The method of claim 1, wherein the heating of the first slurry is performed at a temperature of from about 70° C. to about 200° C.

7. The method of claim 1, wherein the preparing the zinc chalcogenide solution further comprises:
adding the filtered second slurry in an excess of a cleaning solvent to obtain a third slurry in which the zinc chalcogenide is precipitated;
filtering the third slurry to separate the precipitated zinc chalcogenide from the third slurry; and
dissolving the separated zinc chalcogenide in the solvent.

8. The method of claim 7, wherein the cleaning solvent comprises methanol, ethanol, butanol, isopropanol, acetone, or a combination thereof.

9. The method of claim 1, wherein a concentration of the zinc chalcogenide in the zinc chalcogenide solution is in a range of from about $10^{-6}$M to about 10M.

10. The method of claim 1, wherein the applying the zinc chalcogenide solution onto the substrate comprises dropping the zinc chalcogenide solution onto the substrate, or dropping the zinc chalcogenide solution onto the substrate and spin-coating the same on the substrate.

11. The method of claim 1, wherein the drying the zinc chalcogenide solution is performed at a temperature of from about 70° C. to about 200° C.

12. The method of claim 1, wherein the annealing the substrate is performed in air.

13. The method of claim 1, wherein the annealing the substrate is performed at a temperature of from about 100° C. to about 300° C.

14. The method of claim 1, wherein the ZnO nanowire resulting from the annealing the substrate in the presence of oxygen is a free-standing nanowire that is not adhered to the substrate.

15. A ZnO nanowire prepared by the method of claim 1 and represented $ZnX_\alpha O_\beta$,
wherein X is tellurium (Te), selenium (Se), or sulfur (S);
$\alpha$ is a real number of from 0 to 0.95; and
$\beta$ is a real number of from 0.05 to 1.

16. The ZnO nanowire of claim 15, wherein the ZnO nanowire does not comprise an organic ligand.

17. The ZnO nanowire of claim 15, wherein the ZnO nanowire is an n-type semiconductor.

* * * * *